United States Patent
Ohashi et al.

(10) Patent No.: US 12,106,998 B2
(45) Date of Patent: Oct. 1, 2024

(54) SUBSTRATE PROCESSING APPARATUS, SUBSTRATE PROCESSING METHOD, NON-TRANSITORY COMPUTER-READABLE RECORDING MEDIUM AND METHOD OF MANUFACTURING SEMICONDUCTOR DEVICE

(71) Applicant: Kokusai Electric Corporation, Tokyo (JP)

(72) Inventors: Naofumi Ohashi, Toyama (JP); Teruo Yoshino, Toyama (JP); Masanori Nakayama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 107 days.

(21) Appl. No.: 17/887,921

(22) Filed: Aug. 15, 2022

(65) Prior Publication Data
US 2023/0064868 A1    Mar. 2, 2023

(30) Foreign Application Priority Data

Aug. 27, 2021    (JP) .................................. 2021-138907

(51) Int. Cl.
*H01L 21/687*    (2006.01)
(52) U.S. Cl.
CPC .................. *H01L 21/68742* (2013.01); *H01L 21/68764* (2013.01); *H01L 21/68785* (2013.01)
(58) Field of Classification Search
CPC ......... H01L 21/68741; H01L 21/68764; H01L 21/68785
See application file for complete search history.

(56) References Cited

U.S. PATENT DOCUMENTS 6,435,798 B1    8/2002   Satoh
2018/0050368 A1    2/2018   Harumoto et al.
(Continued)

FOREIGN PATENT DOCUMENTS

JP    2000-026192 A    1/2000
JP    2000-294620 A    10/2000
(Continued)

OTHER PUBLICATIONS

English translation KR20170142889 (Year: 2017).*
(Continued)

*Primary Examiner* — Jason L Vaughan
*Assistant Examiner* — Amanda Kreiling
(74) *Attorney, Agent, or Firm* — Edell, Shapiro & Finnan, LLC

(57) ABSTRACT

There is provided a technique capable of preventing a diffusion of a film-forming gas through a through-hole. According to one aspect thereof, there is provided a substrate processing apparatus including: a substrate mounting table; through-holes at the substrate mounting table; lift pins; an elevator capable of elevating or lowering the substrate mounting table or the lift pins or both; and a controller capable of controlling the elevator so as to perform: (a) placing a substrate on the lift pins protruding from a surface of the substrate mounting table through the through-holes; (b) placing the substrate on the surface of the substrate mounting table by moving the substrate mounting table or the lift pins or both; (c) stopping the substrate mounting table at a substrate processing position; and (d) moving the lift pins to positions in the through-holes at which the lift pins are out of contact with the substrate.

11 Claims, 5 Drawing Sheets

(56) References Cited

U.S. PATENT DOCUMENTS

| | | |
|---|---|---|
| 2018/0350644 A1 | 12/2018 | Matsuura |
| 2020/0095120 A1 | 3/2020 | Ohashi et al. |
| 2020/0294833 A1 | 9/2020 | Takano |
| 2020/0335385 A1 | 10/2020 | Saitou et al. |
| 2021/0193503 A1 | 6/2021 | Wagatsuma et al. |

FOREIGN PATENT DOCUMENTS

| | | | |
|---|---|---|---|
| JP | 2003-124297 A | 4/2003 | |
| JP | 2020-049575 A | 4/2020 | |
| JP | 2020-150009 A | 9/2020 | |
| JP | 2020-150151 A | 9/2020 | |
| JP | 2020-177967 A | 10/2020 | |
| JP | 2021-97162 A | 6/2021 | |
| KR | 10-2017-0142889 A | 12/2017 | |
| KR | 2017142889 A * | 12/2017 | ............. H01L 21/02 |

OTHER PUBLICATIONS

Extended European Search Report in European Application No. 22191289.2, issued Jan. 18, 2023, 9 pages.

Request for the Submission of an Opinion with English translation in Korean Application No. 10-2022-0098593, dated Mar. 23, 2024, 12 pages.

* cited by examiner

SUBSTRATE PROCESSING APPARATUS, SUBSTRATE PROCESSING METHOD, NON-TRANSITORY COMPUTER-READABLE RECORDING MEDIUM AND METHOD OF MANUFACTURING SEMICONDUCTOR DEVICE

CROSS REFERENCE TO RELATED APPLICATIONS

This application claims foreign priority under 35 U.S.C. § 119(a)-(d) to Japanese Patent Application No. 2021-138907, filed on Aug. 27, 2021, the entire contents of which are hereby incorporated by reference.

TECHNICAL FIELD

The present disclosure relates to a substrate processing apparatus, a substrate processing method, a non-transitory computer-readable recording medium and a method of manufacturing a semiconductor device.

BACKGROUND

According to some related arts, in a substrate processing in a manufacturing process of a semiconductor device, a substrate processing apparatus (also referred to as a "semiconductor manufacturing apparatus") is used. In the substrate processing apparatus described above, when a substrate mounting table (also referred to as a "susceptor") is lowered to a substrate transfer position, an upper end portion of a lift pin protrudes from an upper surface of the substrate placing surface of the substrate mounting table, and the lift pin supports a substrate from thereunder. Further, when the substrate mounting table is elevated to a substrate processing position, the lift pin is buried from the upper surface of the substrate placing surface, and the substrate placing surface supports the substrate from thereunder.

The substrate mounting table may be provided with a through-hole through which the lift pin is elevated or lowered such that the substrate is capable of being elevated from the substrate mounting table by the lift pin when the substrate is transferred to the substrate mounting table. As a problem caused by the through-hole, since a film-forming gas may be supplied to a back surface of the substrate and the upper surface of the substrate placing surface through the through-hole when a film-forming process is performed, an amount of heat radiation may change on the back surface of the substrate and the upper surface of the substrate placing surface. As a result, a temperature distribution may deteriorate.

SUMMARY

According to the present disclosure, there is provided a technique capable of preventing a diffusion of a film-forming gas through a through-hole.

Other objects and novel features of the technique of the present disclosure will become apparent from the descriptions of the present specification and the accompanying drawings.

The following is a brief overview of a representative one of the techniques of the present disclosure.

That is, according to one aspect of the technique of the present disclosure, there is provided a substrate processing method including: (a) placing a substrate on a plurality of lift pins protruding from a surface of a substrate mounting table through a plurality of through-holes provided at the substrate mounting table; (b) placing the substrate on the surface of the substrate mounting table by moving the substrate mounting table or the plurality of lift pins or both; (c) stopping the substrate mounting table at a substrate processing position; and (d) moving the plurality of lift pins to positions in the plurality of through-holes at which the plurality of lift pins are out of contact with the substrate.

DETAILED DESCRIPTION

Embodiments

Figure 1:
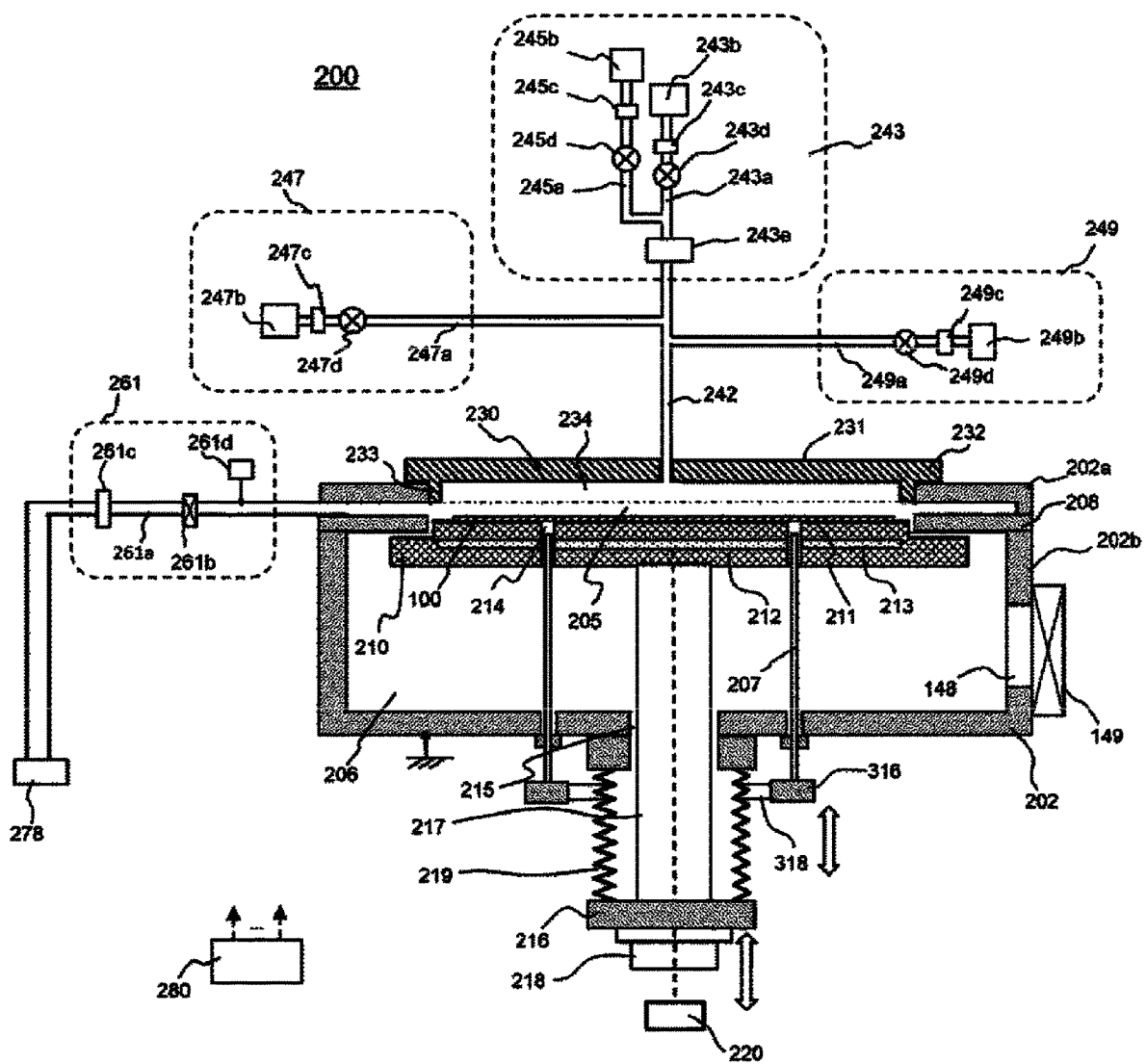
FIG. 1 is a diagram schematically illustrating a vertical cross-section of a substrate processing apparatus according to one or more embodiments of the present disclosure.

Hereinafter, one or more embodiments (also simply referred to as "embodiments") according to the technique of the present disclosure will be described with reference to the drawings. Like reference numerals represent like components in the drawings, and redundant descriptions related thereto may be omitted. In the drawings, for the sake of clarity of the descriptions, features may be schematically illustrated as compared with actual features. However, the drawings are merely examples of the embodiments, and the embodiments according to the technique of the present disclosure are not limited thereto. For example, a relationship between dimensions of each component and a ratio of each component shown in the drawing may not always match the actual ones. Further, even between the drawings, the relationship between the dimensions of each component and the ratio of each component may not always match.

(1) Outline of Substrate Processing Apparatus

A substrate processing apparatus described in the present embodiments is used in a manufacturing process of a semiconductor device. The substrate processing apparatus is configured to perform a processing on a substrate to be processed by heating the substrate by a component such as a heater while the substrate is accommodated in a process chamber. As the substrate to be processed by the substrate processing apparatus, for example, a semiconductor wafer substrate (hereinafter, also simply referred to as a "wafer") on which a semiconductor device is manufactured may be used. Further, as the processing performed by the substrate processing apparatus, for example, a process such as an oxidation process, a diffusion process, an annealing process or a reflow process for a carrier activation or a planarization after an ion implantation and a film-forming process by using a thermal CVD (Chemical Vapor Deposition) reaction may be performed.

(2) Schematic Configuration of Substrate Processing Apparatus

Subsequently, a schematic and exemplary configuration of the substrate processing apparatus preferably used in the embodiments of the present disclosure will be described with reference to FIG. 1. FIG. 1 is a diagram schematically illustrating a vertical cross-section of the substrate processing apparatus preferably used in the embodiments of the present disclosure.

Overall Configuration of Substrate Processing Apparatus

A substrate processing apparatus 200 includes a chamber 202. For example, the chamber 202 includes a flat and sealed vessel whose horizontal cross-section is circular. Further, the chamber 202 is made of a metal material such as aluminum (Al) and stainless steel (SUS). A process space 205 in which a substrate 100 such as a silicon substrate is processed and a transfer space 206 through which the substrate 100 is transferred into or out of the process space 205 are provided in the chamber 202. The chamber 202 is constituted by an upper vessel 202a and a lower vessel 202b. A partition plate 208 is provided between the upper vessel 202a and the lower vessel 202b.

A substrate loading/unloading port 148 is provided adjacent to a gate valve 149 at a side surface of the lower vessel 202b. The substrate 100 is transferred between the transfer space 206 and a vacuum transfer chamber (not shown) through the substrate loading/unloading port 148. A plurality of lift pins 207 are provided at a bottom of the lower vessel 202b. In addition, the lower vessel 202b is electrically grounded.

A process chamber constituting the process space 205 is constituted by a substrate mounting table (also referred to as a "susceptor") 212 and a shower head 230, which will be described later. A substrate support 210 configured to support the substrate 100 is provided in the process space 205. The substrate support 210 mainly includes: the substrate mounting table 212 provided with a substrate placing surface 211 on which the substrate 100 is placed; and a heater 213 serving as a heating source provided in the substrate mounting table 212. A plurality of through-holes 214 through which the lift pins 207 penetrate are provided at positions of the substrate mounting table 212 in a manner corresponding to the lift pins 207. A temperature controller (also referred to as a "heater temperature controller") 220 configured to control a temperature of the heater 213 is connected to the heater 213.

The substrate mounting table 212 is supported by a shaft 217. A support portion of the shaft 217 penetrates a hole 215 provided at a bottom wall of the chamber 202, and is connected to an elevator 218 at an outside of the chamber 202 via a support plate 216. The elevator 218 serves as a first elevator (which is a driving structure or a driving system). By operating the elevator 218 by elevating or lowering the shaft 217 and the substrate mounting table 212, the substrate 100 placed on the substrate placing surface 211 of the substrate mounting table 212 may be elevated or lowered. A bellows 219 covers a periphery of a lower end of the shaft 217. Thereby, it is possible to maintain the chamber 202 airtight.

When the substrate 100 is transferred, the substrate mounting table 212 is lowered until the substrate placing surface 211 reaches a transfer position (hereinafter, also referred to as a "substrate transfer position") at which the substrate placing surface 211 faces the substrate loading/unloading port 148. When the substrate 100 is processed, the substrate mounting table 212 is elevated until the substrate 100 reaches a processing position (hereinafter, also referred to as a "substrate processing position") in the process space 205 as shown in FIG. 1.

The lift pins 207 are connected to an elevator 318 at the outside of the chamber 202 via a support plate 316. The elevator 318 serves as a second elevator (which is a driving structure or a driving system). By elevating or lowering the lift pins 207 by operating the elevator 318, front ends (tips) of the lift pins 207 protrude from an upper surface of the substrate placing surface 211 such that the front ends of the lift pins 207 are capable of supporting the substrate 100 from thereunder. Further, by burying the front ends of the lift pins 207 into the through-holes 214 by operating the elevator 318, the front ends of the lift pins 207 are capable of closing the through-holes 214.

Specifically, when the substrate mounting table 212 is lowered to the substrate transfer position ("P1"), upper ends (that is, the front ends) of the lift pins 207 protrude from the upper surface of the substrate placing surface 211, and the lift pins 207 support the substrate 100 from thereunder. In addition, as shown in FIG. 1, when the substrate mounting table 212 is elevated to the substrate processing position ("P3"), the front ends of the lift pins 207 are moved to positions in the through-holes 214 of the substrate mounting table 212 at which the front ends of the lift pins 207 do not contact the substrate 100, and the plurality of lift pins 207 are capable of closing the through-holes 214 of the substrate mounting table 212. That is, the front ends of the lift pins 207 are buried under the upper surface of the substrate placing surface 211 into the through-holes 214, and the substrate placing surface 211 supports a back surface of the substrate 100 from thereunder.

Figure 2:
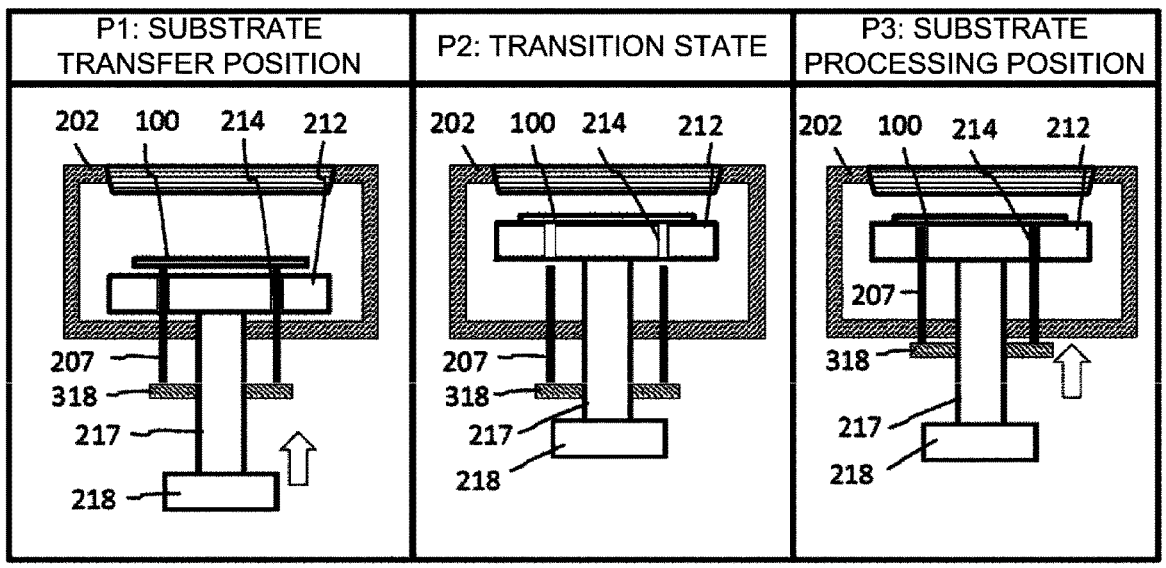
FIG. 2 is a diagram schematically illustrating states of a substrate mounting table and lift pins according to the embodiments of the present disclosure.
Figure 3:
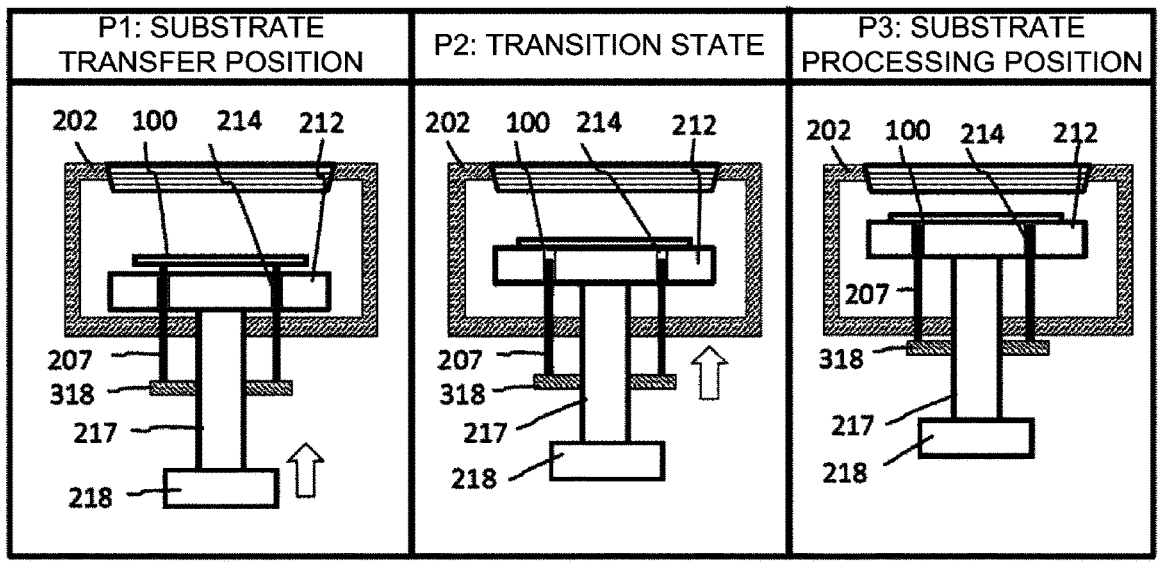
FIG. 3 is a diagram schematically illustrating the states of the substrate mounting table and the lift pins according to a first modified example of the embodiments of the present disclosure.
Figure 4:
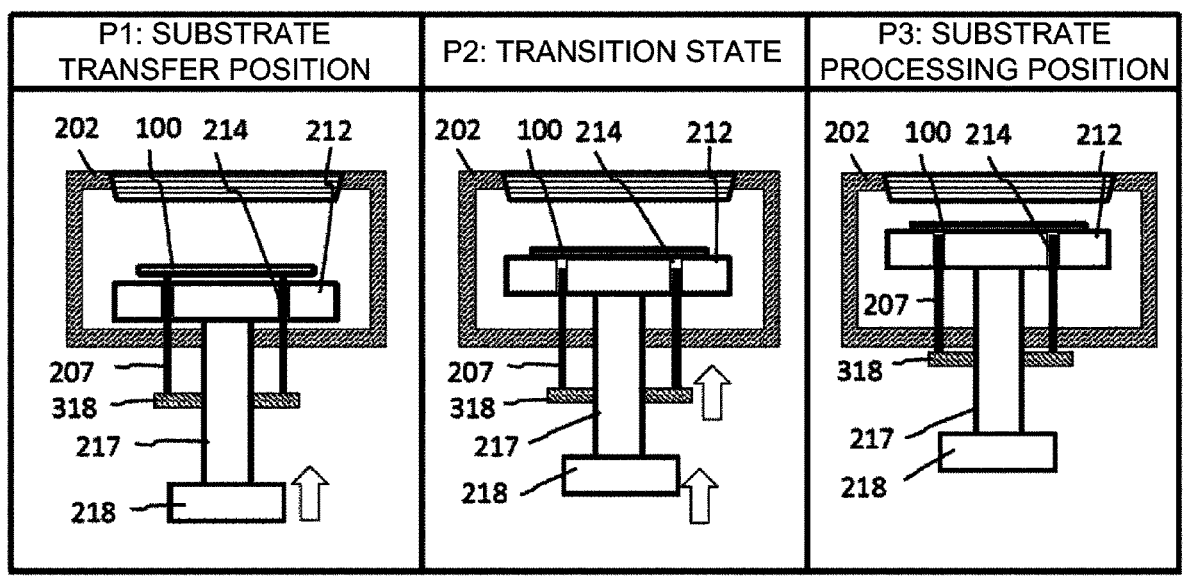
FIG. 4 is a diagram schematically illustrating the states of the substrate mounting table and the lift pins according to a second modified example of the embodiments of the present disclosure.

Subsequently, states of the substrate mounting table 212 and the lift pins 207 according to the embodiments of the present disclosure will be described with reference to FIGS. 2 through 4. For example, descriptions will be related to three states: a state at which the substrate mounting table 212 is at the substrate transfer position P1; a state at which the substrate mounting table 212 is at the substrate processing position P3; and a transition state ("P2") of the substrate mounting table 212 during which a transition proceeds from the substrate transfer position P1 to the substrate processing position P3. FIG. 2 is a diagram schematically illustrating the states of the substrate mounting table 212 and the lift pins 207 according to the embodiments of the present disclosure. FIG. 3 is a diagram schematically illustrating the states of the substrate mounting table 212 and the lift pins 207 according to a first modified example of the embodiments of the present disclosure. FIG. 4 is a diagram schematically illustrating the states of the substrate mounting table 212 and the lift pins 207 according to a second modified example of the embodiments of the present disclosure. In FIGS. 2 through 4, an exemplary configuration of the substrate processing apparatus 200 in which the elevator 218 for the substrate mounting table 212 and the shaft 217 and the elevator 318 for the lift pins 207 are provided separately from each other is illustrated.

In FIG. 2, an exemplary structure in which the substrate mounting table 212 is elevated or lowered and the lift pins 207 are elevated or lowered independently of the substrate mounting table 212 is illustrated. As shown in FIG. 2, the state at which the substrate mounting table 212 is at the substrate transfer position P1 is reached by lowering the substrate mounting table 212 to the substrate transfer position P1. In such a state, positions of the lift pins 207 are controlled by the elevator 318 such that the upper ends of the lift pins 207 protrude from the upper surface of the substrate placing surface 211 through the through-holes 214 of the substrate mounting table 212. Thereby, the upper ends of the lift pins 207 are capable of supporting the back surface of the substrate 100 from thereunder. After the substrate 100 is transferred to the substrate mounting table 212 and supported by the upper ends of the lift pins 207, the substrate mounting table 212 is elevated to the substrate processing position P3 under the control of the elevator 218. That is, in the state at which the substrate mounting table 212 is at the substrate transfer position P1, a step of placing the substrate 100 on the plurality of lift pins 207 protruding from a surface (that is, the upper surface) of the substrate placing surface 211 of the substrate mounting table 212 through the through-holes 214 provided in the substrate mounting table 212 is performed.

Subsequently, in the transition state P2 of the substrate mounting table 212 during the transition from the substrate transfer position P1 to the substrate processing position P3, the elevator 218 elevates the substrate mounting table 212 and the shaft 217 such that the substrate mounting table 212 is located at the substrate processing position P3. Since the lift pins 207 are not elevated, each of the through-holes 214 of the substrate mounting table 212 is in an open state. That is, in the transition state P2, a step of placing the substrate 100 on the surface of the substrate placing surface 211 of the substrate mounting table 212 by elevating the substrate mounting table 212 and a step of stopping the substrate mounting table 212 at the substrate processing position P3 are performed.

Subsequently, in the state at which the substrate mounting table 212 is at the substrate processing position P3, the substrate mounting table 212 maintains the substrate processing position P3, and the positions of the lift pins 207 are elevated by the elevator 318 such that the front ends of the lift pins 207 are moved to the positions in the through-holes 214 of the substrate mounting table 212 at which the front ends of the lift pins 207 do not contact the back surface of the substrate 100. Thereby, the plurality of lift pins 207 are capable of closing the through-holes 214 of the substrate mounting table 212. That is, in the state at which the substrate mounting table 212 is at the substrate processing position P3, a step of moving the lift pins 207 to the positions in the through-holes 214 at which the plurality of lift pins 207 do not contact the back surface of the substrate 100 is performed.

In FIG. 2, the substrate mounting table 212 is elevated or lowered by the elevator 218 and the lift pins 207 are elevated or lowered by the elevator 318 independently of the substrate mounting table 212. Thereby, since the substrate mounting table 212 and the lift pins 207 can be moved individually from each other, it is possible to close the through-holes 214 at appropriate positions by using the lift pins 207. As a result, it is possible to control the open/close state of the through-holes 214 appropriately for the film-forming process (for example, depending on a parameter such as a pressure and a flow rate).

In FIG. 3, an exemplary structure in which the substrate mounting table 212 is elevated or lowered and the lift pins 207 are elevated or lowered together with the substrate mounting table 212 without being in contact with the substrate mounting table 212 and the substrate 100 is illustrated. The exemplary structure shown in FIG. 3 is different from the exemplary structure shown in FIG. 2 in that, in the transition state P2 of the substrate mounting table 212 of FIG. 3, the lift pins 207 are also elevated by the elevator 318 while the substrate mounting table 212 is being elevated by the elevator 218. In the transition state P2, the positions of the lift pins 207 are controlled by the elevator 318 such that the lift pins 207 are elevated without being in contact with the substrate 100 and the substrate mounting table 212. Since the state at which the substrate mounting table 212 is at the substrate transfer position P1 and the state at which the substrate mounting table 212 is at the substrate processing position P3 of FIG. 3 are the same as the state at which the substrate mounting table 212 is at the substrate transfer position P1 and the state at which the substrate mounting table 212 is at the substrate processing position P3 of FIG. 2, redundant descriptions thereof will be omitted.

That is, in the exemplary structure shown in FIG. 3, the step of placing the substrate 100 on the surface of the substrate placing surface 211 of the substrate mounting table 212 by elevating the substrate mounting table 212 by the elevator 218, and a step of elevating the plurality of lift pins 207 together with the substrate mounting table 212 without being in contact with the substrate mounting table 212 and the substrate 100 during the step of placing the substrate 100 on the surface of the substrate placing surface 211 of the substrate mounting table 212 are performed. In the exemplary structure shown in FIG. 3, the state at which the substrate mounting table 212 is at the substrate processing position P3 may be regarded as the step of stopping the substrate mounting table 212 at the substrate processing position P3 is performed.

In FIG. 3, since the lift pins 207 are moved in conjunction with the substrate mounting table 212, each of the through-holes 214 of the substrate mounting table 212 is not in the open state. Therefore, even while the substrate mounting table 212 is being moved, states of the back surface of the substrate 100 and the surface (front surface) of the substrate placing surface 211 of the substrate mounting table 212 remain unchanged. As a result, a temperature change is unlikely to occur.

In FIG. 4, similar to FIG. 3, an exemplary structure in which the substrate mounting table 212 is elevated or lowered and the lift pins 207 are elevated or lowered together with the substrate mounting table 212 without being in contact with the substrate mounting table 212 and the substrate 100 is illustrated. The exemplary structure shown in FIG. 4 is different from the exemplary structure shown in FIG. 3 in that, in the transition state P2 of the substrate mounting table 212 of FIG. 4, the lift pins 207 are also elevated by the elevator 318 in parallel with elevating the substrate mounting table 212 by the elevator 218. That is, in the transition state P2, the elevator 218 and the elevator 318 operate in parallel. Since the other configurations of the exemplary structure shown in FIG. 4 are the same as those of the exemplary structure shown in FIG. 3, redundant descriptions thereof will be omitted.

According to the exemplary structure shown in FIG. 4, it is possible to obtain substantially the same effects as those according to the exemplary structure shown in FIG. 3. Further, it is possible to control the open/close state of the through-holes 214 appropriately for the film-forming process (for example, depending on the parameter such as the pressure and the flow rate).

The descriptions based on FIGS. 2 through 4 can be summarized as follows.

(1) As described with reference to FIG. 2, the following steps are performed.
  (a) a step of placing the substrate 100 on the plurality of lift pins 207 protruding from the surface of the substrate mounting table 212 through the through-holes 214 provided in the substrate mounting table 212;
  (b) a step of placing the substrate 100 on the surface of the substrate mounting table 212 by moving (or elevating) the substrate mounting table 212;
  (c) a step of stopping the substrate mounting table 212 at the substrate processing position P3 after (b); and
  (d) a step of moving the plurality of lift pins 207 to the positions in the through-holes 214 at which the lift pins 207 do not contact the substrate 100.

Thereby, the substrate processing apparatus 200 is capable of closing the through-holes 214 of the substrate mounting table 212 with the plurality of lift pins 207.

(2) As described with reference to FIGS. 3 and 4, the following steps are performed.
  (a-1) a step of placing the substrate 100 on the plurality of lift pins 207 protruding from the surface of the substrate mounting table 212 through the through-holes 214 provided in the substrate mounting table 212;
  (b-1) a step of placing the substrate 100 on the surface of the substrate mounting table 212 by moving (or elevating) the substrate mounting table 212;
  (c-1) a step of elevating the plurality of lift pins 207 together with the substrate mounting table 212 without being in contact with the substrate mounting table 212 and the substrate 100 during (b-1); and
  (d-1) a step of stopping the substrate mounting table 212 at the substrate processing position P3.

Thereby, the substrate processing apparatus 200 is capable of closing the through-holes 214 of the substrate mounting table 212 with the plurality of lift pins 207.

As described with reference to FIGS. 2 through 4, in the state at which the substrate mounting table 212 is at the substrate processing position P3, the plurality of lift pins 207 are capable of closing the through-holes 214 of the substrate mounting table 212. Therefore, it is possible to prevent a film from being formed on the back surface of the substrate 100 and the surface of the substrate placing surface 211 of the substrate mounting table 212 by a film-forming gas supplied through the through-holes 214. Thereby, it is possible to prevent an amount of heat radiation from being changed, and it is also possible to prevent a temperature distribution from being deteriorated.

Referring back to FIG. 1, other configurations of the substrate processing apparatus 200 will be described.

The shower head 230 is provided above (that is, at an upstream side of) the process space 205. The shower head 230 includes a lid 231. The lid 231 includes a flange 232, and the flange 232 is supported by the upper vessel 202a. Further, the lid 231 also includes a position guiding protrusion 233. The lid 231 is fixed by the position guiding protrusion 233 being engaged with the upper vessel 202a.

The shower head 230 includes a buffer space 234. The buffer space 234 refers to a space defined by the lid 231 and the position guiding protrusion 233. The buffer space 234 is spatially in communication with the process space 205. A gas such as the film-forming gas supplied into the buffer space 234 is diffused in the buffer space 234 and uniformly supplied to the process space 205. According to the present embodiments, the buffer space 234 and the process space 205 are separate spaces. However, the present embodiments are not limited thereto. For example, the buffer space 234 may be included in the process space 205.

The process space 205 is defined mainly by the upper vessel 202a and an upper structure of the substrate mounting table 212 at the substrate processing position P3. Structures defining the process space 205 may also be referred to as the process chamber. Further, the structures defining the process space 205 are not limited to the above-described configuration as long as the process space 205 can be defined thereby.

The transfer space 206 is defined mainly by the lower vessel 202b and a lower structure of the substrate mounting table 212 at the substrate processing position P3. Structures defining the transfer space 206 may also be referred to as a "transfer chamber". The transfer chamber is provided under the process chamber. Further, the structures defining the transfer space 206 are not limited to the above-described configuration as long as the transfer space 206 can be defined thereby.

Gas Supplier

Subsequently, a gas supplier (which is a gas supply structure or a gas supply system) will be described. A first gas supply pipe 243a, a second gas supply pipe 247a and a third gas supply pipe 249a are connected to a common gas supply pipe 242.

A first process gas is supplied mainly through a first gas supplier (which is a first gas supply structure or a first gas supply system) 243 including the first gas supply pipe 243a. A second process gas is supplied mainly through a second gas supplier (which is a second gas supply structure or a second gas supply system) 247 including the second gas supply pipe 247a. An inert gas is supplied mainly through a third gas supplier (which is a third gas supply structure or a third gas supply system) 249 including the third gas supply pipe 249a.

First Gas Supplier

A first gas supply source 243b, a mass flow controller (MFC) 243c serving as a flow rate controller (flow rate control structure) and a valve 243d serving as an opening/closing valve are provided at the first gas supply pipe 243a sequentially in this order from an upstream side to a downstream side of the first gas supply pipe 243a in a gas flow direction. A remote plasma structure (also referred to as a "remote plasma unit" or "RPU") 243e serving as a plasma generator is provided at a downstream side of the valve 243d to activate the first process gas into a plasma state.

The first process gas is supplied into the shower head 230 via the first gas supply pipe 243a provided with the mass flow controller 243c and the valve 243d, and the common gas supply pipe 242. The first process gas is activated into the plasma state by the RPU 243e.

The first process gas is one of process gases. For example, an oxygen-containing gas is used as the first process gas. For example, oxygen ($O_2$) gas may be used as the oxygen-containing gas.

The first gas supplier (also referred to as a "first process gas supplier") 243 is constituted mainly by the first gas supply pipe 243a, the MFC 243c, the valve 243d and the RPU 243e. Further, the first process gas supplier 243 may further include the first gas supply source 243b and a hydrogen-containing gas supplier (which is a hydrogen-containing gas supply structure or a hydrogen-containing gas supply system) described later.

A downstream end of a hydrogen-containing gas supply pipe 245a is connected to the first gas supply pipe 243a at a downstream side of the valve 243d provided at the first gas supply pipe 243a. A hydrogen-containing gas supply source 245b, a mass flow controller (MFC) 245c serving as a flow rate controller (flow rate control structure) and a valve 245d serving as an opening/closing valve are provided at the hydrogen-containing gas supply pipe 245a sequentially in this order from an upstream side to a downstream side of the hydrogen-containing gas supply pipe 245a in the gas flow direction. A hydrogen-containing gas is supplied into the shower head 230 via the hydrogen-containing gas supply pipe 245a provided with the mass flow controller 245c and the valve 245d, the first gas supply pipe 243a and the RPU 243e.

For example, hydrogen ($H_2$) gas or water vapor ($H_2O$) gas may be used as the hydrogen-containing gas. The hydrogen-containing gas supplier is constituted mainly by the hydrogen-containing gas supply pipe 245a, the MFC 245c and the valve 245d. In addition, the hydrogen-containing gas supplier may further include the hydrogen-containing gas supply source 245b, the first gas supply pipe 243a and the RPU 243e. In addition, as described above, the first gas supplier 243 may further include the hydrogen-containing gas supplier.

Second Gas Supplier

A second gas supply source 247b, a mass flow controller (MFC) 247c serving as a flow rate controller (flow rate control structure) and a valve 247d serving as an opening/closing valve are provided at the second gas supply pipe 247a sequentially in this order from an upstream side to a downstream side of the second gas supply pipe 247a in the gas flow direction.

A gas containing a second element (hereinafter, also referred to as the "second process gas") is supplied into the shower head 230 via the second gas supply pipe 247a provided with the mass flow controller 247c and the valve 247d, and the common gas supply pipe 242.

The second process gas is one of the process gases. For example, a process gas containing silicon (Si) is used as the second process gas. That is, for example, the second process gas is a silicon-containing gas. For example, a silane-based gas such as monosilane (SiH4) gas, disilane (Si2H6) gas and trisilane (Si3H8) gas may be used as the silicon-containing gas. For example, a gas such as tetraethyl orthosilicate (Si(OC2H5)4, also referred to as "TEOS") gas may be used as the silicon-containing gas further containing impurities such as carbon (C) and boron (B).

The second gas supplier (also referred to as a "second process gas supplier") 247 is constituted mainly by the second gas supply pipe 247a, the MFC 247c and the valve 247d. The second process gas supplier 247 may also be referred to as a "silicon-containing gas supplier 247" (which is a silicon-containing gas supply structure or a silicon-containing gas supply system).

Third Gas Supplier

A third gas supply source 249b, a mass flow controller (MFC) 249c serving as a flow rate controller (flow rate control structure) and a valve 249d serving as an opening/closing valve are provided at the third gas supply pipe 249a sequentially in this order from an upstream side to a downstream side of the third gas supply pipe 249a in the gas flow direction.

The third gas supply source 249b is an inert gas supply source. As the inert gas, for example, nitrogen (N2) gas may be used.

The third gas supplier 249 is constituted mainly by the third gas supply pipe 249a, the MFC 249c and the valve 249d.

The inert gas supplied from the third gas supply source (also referred to as the "inert gas supply source") 249b acts as a purge gas of purging a residual gas in the chamber 202 or in the shower head 230 during a substrate processing described later.

Exhauster

An exhauster (which is an exhaust structure or an exhaust system) configured to exhaust an inner atmosphere of the chamber 202 is constituted mainly by a process space exhauster (which is a process space exhaust structure or a process space exhaust system) 261 configured to exhaust an inner atmosphere of the process space 205.

The process space exhauster 261 includes an exhaust pipe 261a connected to the process space 205. The exhaust pipe 261a is spatially in communication with the process space 205. An APC (Automatic Pressure Controller) 261c serving as a pressure regulator configured to adjust an inner pressure of the process space 205 to a predetermined pressure and a first pressure detector 261d of detecting the inner pressure of the process space 205 are provided at the exhaust pipe 261a. The APC 261c includes a valve body (not shown) capable of adjusting an opening degree thereof. The APC 261c is configured to adjust a conductance of the exhaust pipe 261a in accordance with an instruction from a controller 280 described later. Further, a valve 261b is provided at an upstream side of the APC 261c provided at the exhaust pipe 261a. The exhaust pipe 261a, the valve 261b, the APC 261c and the first pressure detector 261d are collectively referred to as the process space exhauster 261.

A dry pump (DP) 278 serving as a vacuum pump is provided at a downstream side of the exhaust pipe 261a. The DP 278 exhausts the inner atmosphere of the process space 205 via the exhaust pipe 261a.

Controller

Figure 5:
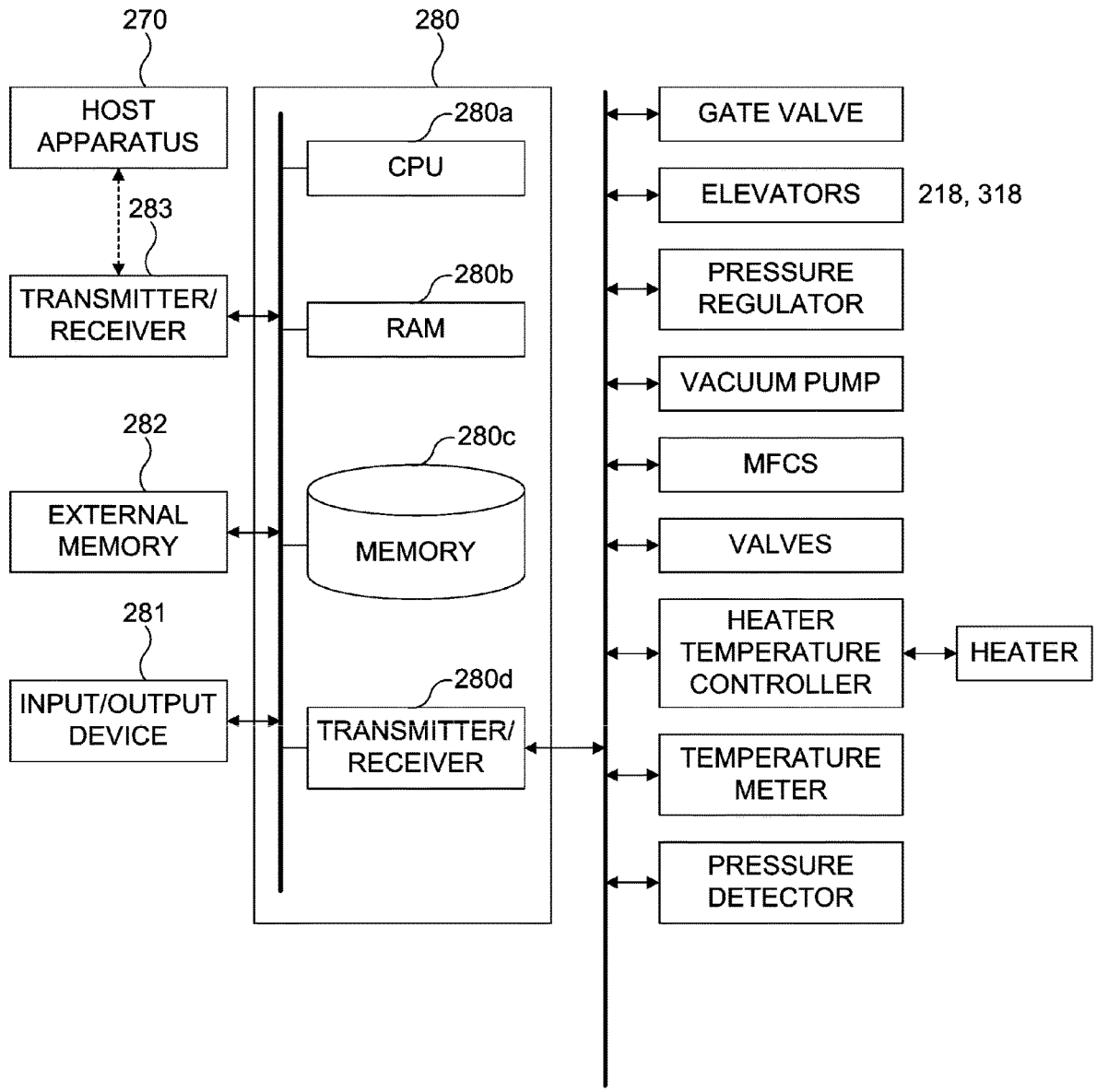
FIG. 5 is a block diagram schematically illustrating a configuration of a controller and related components of the substrate processing apparatus according to the embodiments of the present disclosure.

Subsequently, the controller 280 capable of controlling operations of components constituting the substrate processing apparatus zoo will be described with reference to FIG. 5. FIG. 5 is a diagram schematically illustrating a configuration of the controller 280 and related components of the substrate processing apparatus 200 according to the embodiments of the present disclosure.

The substrate processing apparatus 200 includes the controller 280 configured to control the operations of components constituting the substrate processing apparatus 200. As shown in FIG. 5, the controller 280 includes at least a CPU (Central Processing Unit) 280a serving as an arithmetic processor, a RAM (Random Access Memory) 280b serving as a temporary memory, a memory 280c and a transmitter/receiver 280d. The controller 280 is connected to the components of the substrate processing apparatus 200 via the transmitter/receiver 280d, calls a program or a recipe from the memory 280c in accordance with an instruction from a host controller or a user, and controls the operations of the components of the substrate processing apparatus 200 in accordance with the contents of the instruction. The components of the substrate processing apparatus 200 include the elevators 218 and 318. The controller 280 is configured to be capable of controlling operations of the elevators 218 and 318 by performing the program in which sequences for performing each step (that is, the step (a) through the step (d) and the step (a-1) through the step (d-1)) described with reference to FIGS. 2 through 4 are written.

For example, the controller 280 may be embodied by a dedicated computer or by a general-purpose computer. For example, the controller 280 according to the present embodiments may be embodied by preparing an external memory 282 storing the program and by installing the program onto the general-purpose computer by using the external memory 282. For example, the external memory 282 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. A method of providing the program to the computer is not limited to that described above using the external memory 282. For example, the program may be supplied to the computer (general-purpose computer) by using a communication structure such as the Internet and a dedicated line. The program may also be provided to the computer without using the external memory 282 by receiving information (that is, the program) from a host apparatus 270 via a transmitter/receiver 283. In addition, a user can input an instruction to the controller 280 by using an input/output device 281 such as a keyboard and a touch panel.

For example, the memory 280c or the external memory 282 may be embodied by a non-transitory computer readable recording medium. Hereafter, the memory 280c and the external memory 282 may be collectively or individually referred to as a "recording medium". Thus, in the present specification, the term "recording medium" may refer to the memory 280c alone, may refer to the external memory 282 alone, or may refer to both of the memory 280c and the external memory 282.

Substrate Processing

Subsequently, the substrate processing serving as a part of a manufacturing process of a semiconductor device will be described. The substrate processing will be described by way of an example in which a film-forming step of forming a silicon oxide film ($SiO_2$ film) containing carbon on the substrate 100 is performed. Hereinafter, the substrate processing will be described by way of an example in which the exemplary structure shown in FIG. 2 is used. However, the exemplary structure shown in FIG. 3 or the exemplary structure shown in FIG. 4 may be used. Further, an exemplary structure shown in FIG. 6 described later according to another modified example may be used.

Substrate Loading Step

In the substrate processing apparatus 200 of FIG. 1, the gate valve 149 is opened, and the substrate 100 is loaded (transferred) into the lower vessel 202b of the chamber 202 through the substrate loading/unloading port 148. The substrate 100 is placed on the plurality of lift pins 207 protruding from the surface of the substrate mounting table 212 through the through-holes 214 provided in the substrate mounting table 212 (see, for example, the substrate transfer position P1 in FIG. 2). Then, the gate valve 149 is closed. Thereafter, the substrate mounting table 212 is elevated, and the substrate 100 is placed on the surface of the substrate mounting table 212 (see, for example, the transition state P2 in FIG. 2). Then, the substrate mounting table 212 is stopped at the substrate processing position P3, and subsequently, the plurality of lift pins 207 are moved to the positions in the through-holes 214 at which the lift pins 207 do not contact the substrate 100 (see, for example, the substrate processing position P3 in FIG. 2). As a result, the plurality of lift pins 207 are capable of closing the through-holes 214 of the substrate mounting table 212. The substrate 100 is in a state shown in FIG. 1.

Film-Forming Step

After heating the substrate 100 at the substrate processing position P3 to a predetermined temperature, the silicon-containing gas and the oxygen-containing gas are supplied to the process chamber. The silicon-containing gas contains the impurities such as carbon and boron. As the silicon-containing gas, for example, the TEOS gas is used. As the oxygen-containing gas, for example, the oxygen ($O_2$) gas is used.

The TEOS gas and the $O_2$ gas supplied to the process chamber react with each other to form the film (that is, the $SiO_2$ film containing carbon) on the substrate 100. The $SiO_2$ film containing carbon includes silicon and carbon contained in the TEOS gas and oxygen contained in the $O_2$ gas. Further, as the silicon-containing gas, a gas containing silicon and boron may be used. In such a case, a silicon oxide film ($SiO_2$ film) containing boron instead of carbon is formed. After a predetermined time has elapsed and the $SiO_2$ film containing carbon of a desired thickness is formed on the substrate 100, a supply of each process gas is stopped.

Substrate Unloading Step

The substrate mounting table 212 and the plurality of lift pins 207 are moved to the substrate transfer position P1 in FIG. 2, and the substrate 100 is placed on the plurality of lift pins 207 protruding from the surface of the substrate mounting table 212. Subsequently, the gate valve 149 of the substrate processing apparatus 200 is opened, and the substrate 100 in the chamber 202 is unloaded (transferred) out of the chamber 202 through the substrate loading/unloading port 148. Thereafter, the gate valve 149 is closed, and the substrate processing is completed. The substrate 100 unloaded out of the chamber 202 is transferred so as to perform a subsequent processing.

Another Modified Example

Figure 6:
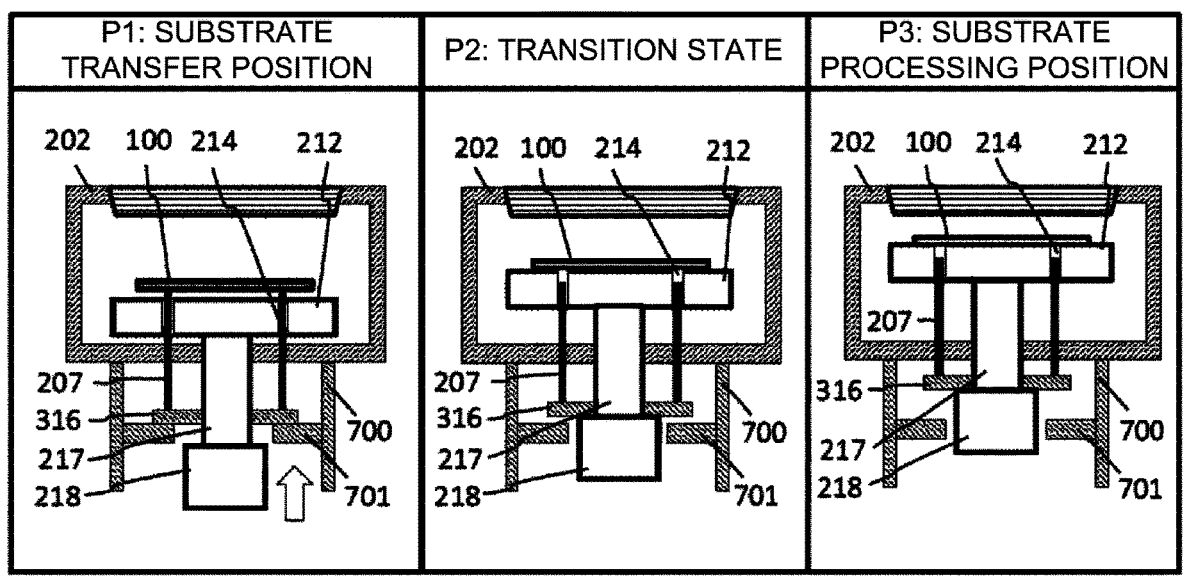
FIG. 6 is a diagram schematically illustrating the states of the substrate mounting table and the lift pins according to a third modified example of the embodiments of the present disclosure.

FIG. 6 is a diagram schematically illustrating the states of the substrate mounting table 212 and the lift pins 207 according to a third modified example of the embodiments of the present disclosure. The embodiments, the first modified example and the second modified example described with reference to FIGS. 2 through 4 are based on the exemplary configuration of the substrate processing apparatus 200 in which the elevator 218 for the substrate mounting table 212 and the shaft 217 and the elevator 318 for the lift pins 207 are provided separately. According to the third modified example shown in FIG. 6, the substrate mounting table 212 is provided with the elevator 218 serving as a driving structure (or a driving system) capable of elevating or lowering the substrate mounting table 212. However, according to the third modified example shown in FIG. 6, the lift pins 207 are not provided with a driving structure (or a driving system) capable of elevating or lowering the lift pins 207, and the lift pins 207 are being elevated or lowered in conjunction with a movement of the substrate mounting table 212.

As shown in FIG. 6, a support (which is a support structure) 701 capable of supporting the support plate 316 (to which the lift pins 207 are provided) from thereunder (that is, from a back surface thereof) is provided below the chamber 202, and a support (which is a support structure) 700 to which the support 701 is attached is provided under the chamber 202. An opening is provided at the support 701 such that the back surface (which is a lower portion) of the support plate 316 can be supported by an upper portion of the elevator 218.

The state at which the substrate mounting table 212 is at the substrate transfer position P1 is reached by lowering the substrate mounting table 212 to the substrate transfer position P1. The lower portion of the support plate 316 is supported by an upper surface of the support 701, and the upper ends of the lift pins 207 protrude from the upper surface of the substrate placing surface 211 through the through-holes 214 of the substrate mounting table 212. Thereby, the upper ends of the lift pins 207 are capable of supporting the back surface of the substrate 100 from thereunder. After the substrate 100 is transferred to the substrate mounting table 212 and supported by the upper ends of the lift pins 207, the substrate mounting table 212 is elevated to the substrate processing position P3 under the control of the elevator 218. That is, in the state at which the substrate mounting table 212 is at the substrate transfer position P1, the step of placing the substrate 100 on the plurality of lift pins 207 protruding from the surface of the substrate mounting table 212 through the through-holes 214 provided in the substrate mounting table 212 is performed.

Subsequently, in the transition state P2 of the substrate mounting table 212, the elevator 218 elevates the substrate mounting table 212 and the shaft 217 such that the substrate mounting table 212 is located at the substrate processing position P3. When the substrate mounting table 212 is elevated above a certain level, the lift pins 207 are elevated in conjunction with an elevation of the substrate mounting table 212. That is, since the lower portion of the support plate 316 supporting the lift pins 207 is supported and elevated by the upper portion of the elevator 218, the lift pins 207 are elevated in conjunction with the elevation of the substrate mounting table 212. Further, the front ends of the lift pins 207 are moved to the positions in the through-holes 214 of the substrate mounting table 212 at which the front ends of the lift pins 207 do not contact the back surface of the substrate 100. Thereby, the lift pins 207 are capable of closing the through-holes 214 of the substrate mounting table 212. That is, in the transition state P2, the step of placing the substrate 100 on the surface of the substrate mounting table 212 by elevating the substrate mounting table 212 and the step of elevating the plurality of lift pins 207 together with the substrate mounting table 212 without being in contact with the substrate mounting table 212 and the substrate 100 during the step of placing the substrate 100 on the surface of the substrate mounting table 212 are performed.

Subsequently, the state at which the substrate mounting table 212 is at the substrate processing position P3 is reached by stopping the substrate mounting table 212 at the substrate processing position P3. The positions of the lift pins 207 are elevated by the elevator 318, and the front ends of the lift pins 207 are maintained at the positions in the through-holes 214 of the substrate mounting table 212 at which the front ends of the lift pins 207 do not contact the back surface of the substrate 100. Thereby, the plurality of lift pins 207 are capable of closing the through-holes 214 of the substrate mounting table 212. That is, in the state at which the substrate mounting table 212 is at the substrate processing position P3, the step of stopping the substrate mounting table 212 at the substrate processing position P3 is performed.

In FIG. 6, similar to FIGS. 3 and 4, since the lift pins 207 are moved in conjunction with the substrate mounting table 212, each of the through-holes 214 of the substrate mounting table 212 is not in the open state. Therefore, even while the substrate mounting table 212 is being moved, the states of the back surface of the substrate 100 and the surface of the substrate placing surface 211 of the substrate mounting table 212 remain unchanged. As a result, the temperature change is unlikely to occur. Thus, in the state at which the substrate mounting table 212 is at the substrate processing position P3, the lift pins 207 are capable of closing the through-holes 214 of the substrate mounting table 212. Therefore, it is possible to prevent the film from being formed on the back surface of the substrate 100 and the surface of the substrate placing surface 211 of the substrate mounting table 212 by the film-forming gas (for example, a gas such as the first process gas and the second process gas) supplied through the through-holes 214. Thereby, it is possible to prevent the amount of heat radiation from being changed, and it is also possible to prevent the temperature distribution from being deteriorated.

OTHER EMBODIMENTS

While the technique of the present disclosure is described in detail by way of the embodiments and modified examples described above, the technique of the present disclosure is not limited thereto. The technique of the present disclosure may be modified in various ways without departing from the scope thereof.

According to some embodiments of the present disclosure, it is possible to prevent a diffusion of the film-forming gas through the through-holes.

What is claimed is:

1. A substrate processing apparatus comprising:
   a substrate mounting table;
   a plurality of through-holes provided at the substrate mounting table;
   a plurality of lift pins;
   an elevator capable of elevating or lowering the substrate mounting table or the plurality of lift pins or both; and
   a controller configured to be capable of controlling the elevator so as to perform:
      (a) placing a substrate on the plurality of lift pins protruding from a surface of the substrate mounting table through the plurality of through-holes;
      (b) placing the substrate on the surface of the substrate mounting table by moving the substrate mounting table or the plurality of lift pins or both;
      (c) stopping the substrate mounting table at a substrate processing position;
      (d) moving the plurality of lift pins to positions in the plurality of through-holes at which the plurality of lift pins are out of contact with the substrate; and
      (e) elevating the plurality of lift pins together with the substrate mounting table without being in contact with the substrate mounting table and the substrate during (b).

2. The substrate processing apparatus of claim 1, wherein the controller is further configured to be capable of controlling the elevator so as to perform (c) after performing (b).

3. The substrate processing apparatus of claim 1, wherein the elevator comprises a first elevator capable of individually elevating or lowering the substrate mounting table and a second elevator capable of individually elevating or lowering the plurality of lift pins.

4. The substrate processing apparatus of claim 1, wherein the elevator comprises a first driving structure capable of elevating or lowering the substrate mounting table without being provided with a second driving structure capable of elevating or lowering the plurality of lift pins, and
   wherein the plurality of lift pins are being elevated or lowered in conjunction with a movement of the substrate mounting table.

5. The substrate processing apparatus of claim 1, wherein the elevator comprises a first elevator capable of elevating or lowering the substrate mounting table and a second elevator capable of elevating or lowering the plurality of lift pins.

6. A substrate processing method comprising:
(a) placing a substrate on a plurality of lift pins protruding from a surface of a substrate mounting table through a plurality of through-holes provided at the substrate mounting table;
(b) placing the substrate on the surface of the substrate mounting table by moving the substrate mounting table or the plurality of lift pins or both;
(c) stopping the substrate mounting table at a substrate processing position;
(d) moving the plurality of lift pins to positions in the plurality of through-holes at which the plurality of lift pins are out of contact with the substrate; and
(e) elevating the plurality of lift pins together with the substrate mounting table without being in contact with the substrate mounting table and the substrate during (b).

7. The substrate processing method of claim 6, wherein (c) is performed after (b).

8. A method of manufacturing a semiconductor device comprising the substrate processing method of claim 6.

9. The method of claim 8, wherein (c) is performed after (b).

10. A non-transitory computer-readable recording medium storing a program that causes, by a computer, a substrate processing apparatus to perform:
(a) placing a substrate on a plurality of lift pins protruding from a surface of a substrate mounting table through a plurality of through-holes provided at the substrate mounting table;
(b) placing the substrate on the surface of the substrate mounting table by moving the substrate mounting table or the plurality of lift pins or both;
(c) stopping the substrate mounting table at a substrate processing position;
(d) moving the plurality of lift pins to positions in the plurality of through-holes at which the plurality of lift pins are out of contact with the substrate; and
(e) elevating the plurality of lift pins together with the substrate mounting table without being in contact with the substrate mounting table and the substrate during (b).

11. The non-transitory computer-readable recording medium of claim 10, wherein (c) is performed after (b).

\* \* \* \* \*